United States Patent
Lee et al.

(10) Patent No.: US 7,047,640 B2
(45) Date of Patent: May 23, 2006

(54) METHOD OF MANUFACTURING A HEAT DISSIPATING DEVICE

(75) Inventors: Hsieh-Kun Lee, Tu-Cheng (TW); Chun-Chi Chen, Tu-Cheng (TW); Shi-Wen Zhou, Shenzhen (CN); Meng Fu, Shenzhen (CN); Chi Liang, Shenzhen (CN)

(73) Assignee: Foxconn Technology Co., Ltd. (TW)

( * ) Notice: Subject to any disclaimer, the term of this patent is extended or adjusted under 35 U.S.C. 154(b) by 0 days.

(21) Appl. No.: 11/069,743

(22) Filed: Mar. 1, 2005

(65) Prior Publication Data

US 2006/0059684 A1  Mar. 23, 2006

(30) Foreign Application Priority Data

Sep. 21, 2004  (CN) .................. 2004 1 00516702

(51) Int. Cl.
*B21D 53/06* (2006.01)
*B23P 15/26* (2006.01)

(52) U.S. Cl. .................. 29/890.046; 29/890.032; 29/890.04; 29/890.041; 29/890.043; 29/890.054; 165/104.21; 165/104.26; 165/104.33; 228/165; 228/182; 228/245; 228/246

(58) Field of Classification Search .......... 29/890.032, 29/890.04, 890.041, 890.043, 890.046, 890.054; 165/104.21, 104.26, 104.33; 228/165, 182, 228/245, 246; 164/98, 112
See application file for complete search history.

(56) References Cited

U.S. PATENT DOCUMENTS

| | | | |
|---|---|---|---|
| 5,385,289 A | * | 1/1995 | Bloch et al. ............. 228/103 |
| 6,321,452 B1 | | 11/2001 | Lin .................. 29/890.032 |
| 6,435,266 B1 | | 8/2002 | Wu ...................... 165/80.3 |
| 6,651,732 B1 | * | 11/2003 | Sagal .................. 165/80.3 |
| 2005/0067149 A1 | * | 3/2005 | Wu .................... 165/104.11 |

* cited by examiner

*Primary Examiner*—Peter Vo
*Assistant Examiner*—Hung C. Le
(74) *Attorney, Agent, or Firm*—Morris Manning & Martin; Tim Tingkang Xia, Esq.

(57) ABSTRACT

A method of manufacturing a heat dissipating device, the method includes steps: a) affording a heat pipe, a solid solder bar and a heat sink, wherein the heat sink includes a base defining a groove at a side thereof; b) placing the solder bar and the heat pipe, in turn, into the groove of the heat sink; c) heating to melt the solder bar and simultaneously pressing the heat pipe to have an outer surface of the heat pipe coplanar with said side where the groove is defined; and d) cooling to achieve the heat dissipating device wherein the solder bar is evenly distributed between the heat pipe and the base.

14 Claims, 3 Drawing Sheets

METHOD OF MANUFACTURING A HEAT DISSIPATING DEVICE

BACKGROUND OF THE INVENTION

1. Field of the Invention

The present invention relates to a method of manufacturing a heat dissipating device, and more particularly to a method of manufacturing a heat dissipating device which is used to remove heat from an electronic component.

2. Description of Prior Art

To keep electronic components in normally operation, heat generated by the electronic components must be removed away. A heat dissipating device, which comprises a heat sink and heat pipes coupled to the heat sink, is a popular option to remove heat from an electronic component.

Conventionally, the heat sink defines a groove at a base where the heat sink contacts the electronic component. The heat pipe is fitted into the groove with thermal grease.

The thermal grease, for fixing the heat pipe into the groove of the heat sink, is generally composed of silicone that decreases heat-transfer rate between the heat pipe and the heat sink. Once the thermal grease absorbs heat, it easily hardens and causes the separation of the heat pipe from the heat sink. The heat pipe cannot be in intimate contact with the heat sink and the heat-transfer rate becomes lower.

Solder paste and solder cream are also used to couple a heat pipe to a heat sink. The solder paste and solder cream are primarily composed of tin (Sn), and are selectively composed of plumbum (Pb), silver (Ag), copper (Cu), or bismuth (Bi). Therefore, both the solder paste and solder cream have a higher heat-transfer rate than the thermal grease.

Unfortunately, the solder paste and solder cream are unfixed in shape before heated. Thus, the distribution of the solder paste or solder cream in the groove is generally uneven. This results in a rough appearance of the solder paste or solder cream between the heat sink and the heat pipe, that is to say, there is a great clearance between the heat sink and the heat pipe where the solder paste or solder cream is few, and an overflow of the solder paste or solder cream from the groove of the heat sink where the solder paste or solder cream is excessive. All of these are undesired consequences.

SUMMARY OF THE INVENTION

Accordingly, an object of the present invention is to provide a method of manufacturing a heat dissipating device, the method capable of diminishing clearance between a heat pipe and a heat sink of the heat dissipating device to achieve a great heat-transfer capability.

In order to achieve the object set out above, a method of manufacturing a heat dissipating device in accordance with a preferred embodiment of the present invention comprises following steps: a) affording a heat pipe, a solid solder bar and a heat sink, wherein the heat sink comprises a base defining a groove at a side thereof; b) placing the solder bar and the heat pipe, in turn, into the groove of the heat sink; c) heating to melt the solder bar and simultaneously pressing the heat pipe to have an outer surface of the heat pipe coplanar with said side where the groove is defined; and d) cooling to achieve the heat dissipating device wherein the solder bar is evenly distributed between the heat pipe and the base.

Other objects, advantages and novel features of the present invention will become more apparent from the following detailed description when taken in conjunction with the accompanying drawings, in which:

DETAILED DESCRIPTION OF THE INVENTION

Figure 1:
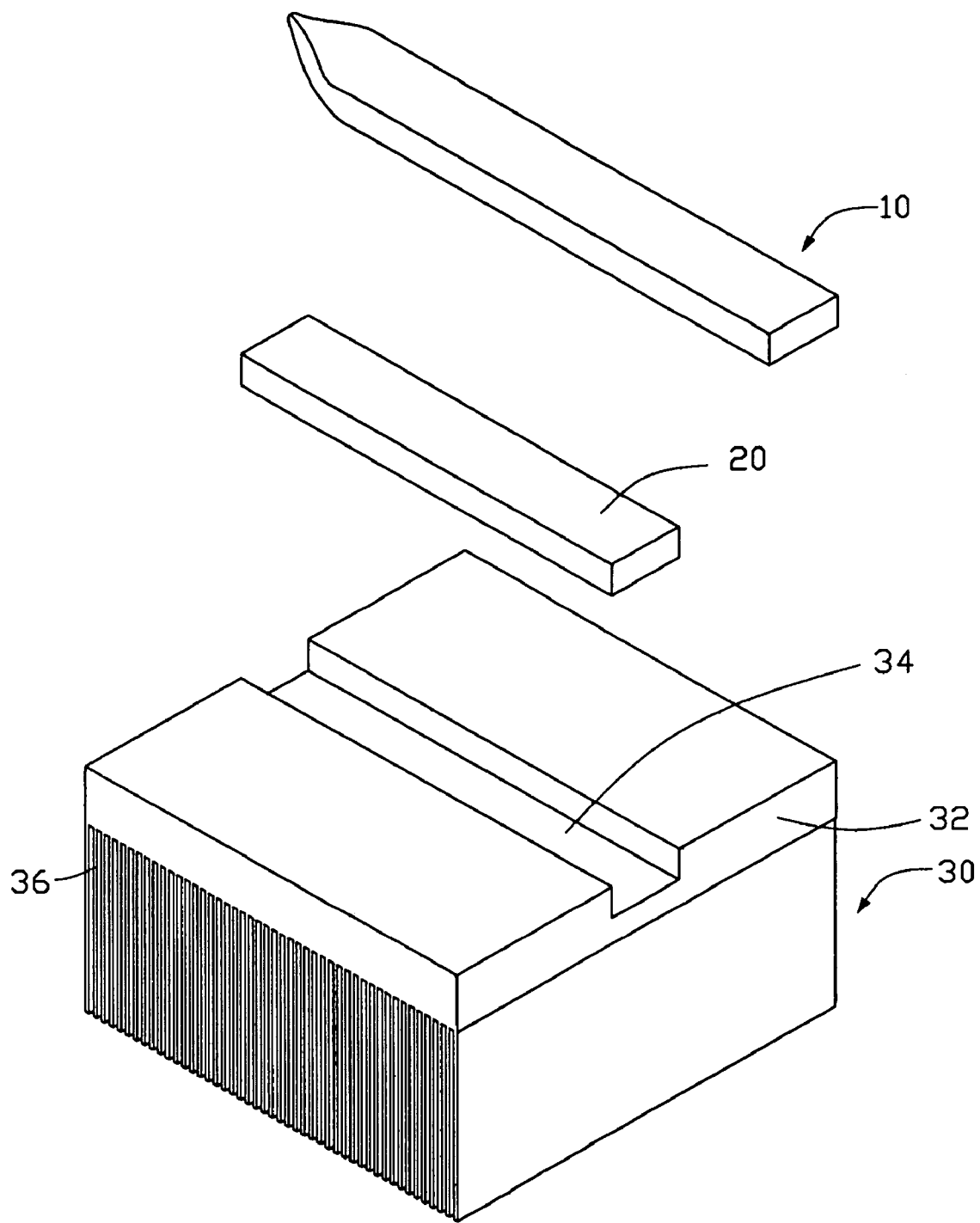
FIG. 1 is an exploded, isometric view of a heat dissipating device in accordance with a preferred embodiment of the present invention.
Figure 2:
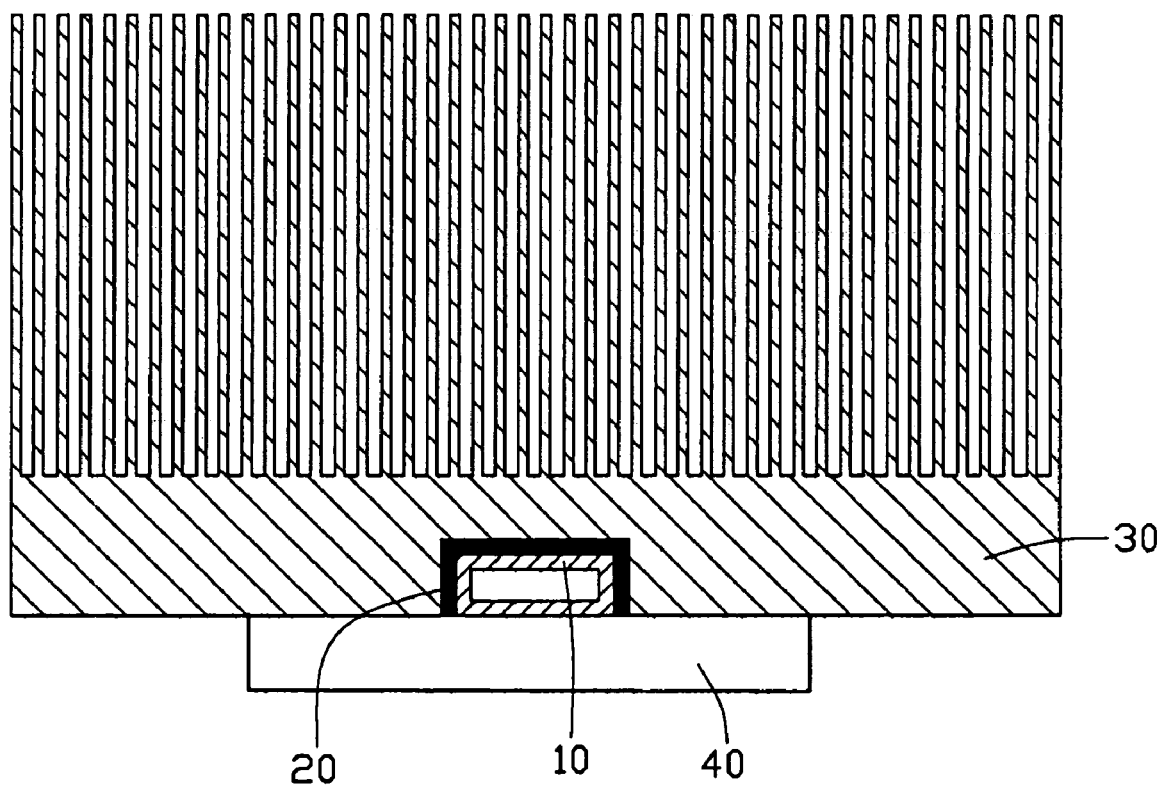
FIG. 2 is a cross-sectional, assembled view of the heat dissipating device of FIG.1 and an electronic component.

Referring to FIGS. 1–2, a heat dissipating device of the preferred embodiment of the invention comprises a portion of heat pipe 10 and a heat sink 30 as two main parts of dissipating heat from a heat source. The heat pipe 10 is illustrated as a flat plate heat pipe in FIGS. 1–2, but not limited like that. The heat sink 30 comprises a rectangular base 32 having a groove 34 defined in a side thereof, and a plurality of fins 36 extending from an opposite side of the base 32 for dissipating heat accumulated on the base 32 to ambient air. The heat pipe 10 is accommodated into the groove 34 of the base 32. An elongated solid solder bar 20 is provided in the groove and is melted by heating to couple the heat pipe 10 to the base 32 of the heat sink 30.

As shown in FIG. 2, the solder bar 20 is evenly distributed between the heat pipe 10 and the base 32 to clean up gaps between the base 32 and the heat pipe 10, to achieve great heat-transfer between the heat pipe 10 and the base 32. The heat pipe 10 has its exposed outer surface coplanar with a bottom surface of the base 32. The heat pipe 10 and the base 32 commonly contact an electronic component 40 for absorbing heat therefrom.

A method of manufacturing the heat dissipating device comprises following steps: a) affording a heat pipe 10; b) affording a heat sink 30 which comprises a base 32 having a groove 34 defined in a side thereof, and a plurality of fins 36 extending from an opposite side of the base 32, wherein a depth of the groove 34 is slightly greater than a thickness of the heat pipe 10; c) affording a solid solder bar 20 configured according to the shape of the groove 34; d) placing the solder bar 20 into the groove 34; e) placing the heat pipe 10 into the groove 34 whereby the heat pipe 10 and the base sandwich the solder bar 20 there between; f) heating to melt the solder bar 20 and simultaneously pressing the heat pipe 10 by a pressing element such as a metal plate of a mold with a planar surface (not shown), so that an exposed outer surface of the heat pipe 10 is coplanar with the side of the base 32 where the groove 34 is defined; g) cooling to achieve the heat dissipating device, wherein the solder bar 20 is evenly distributed between the heat pipe 10 and the base 32.

In the present invention, the solder bar 20 is fixed in shape before heated. When heated, a plate (not shown) is provided to press the heat pipe 10 to have an exposed outer surface of the heat pipe 10 coplanar with said side of the base 32 where the groove 34 is defined. Thus, an outside force has the melted solder bar 20 evenly squeezed between the heat pipe 10 and the base 32 of the heat sink 30, to clean up gaps between the heat pipe 10 and the base 32 of the heat sink 30.

Figure 3:
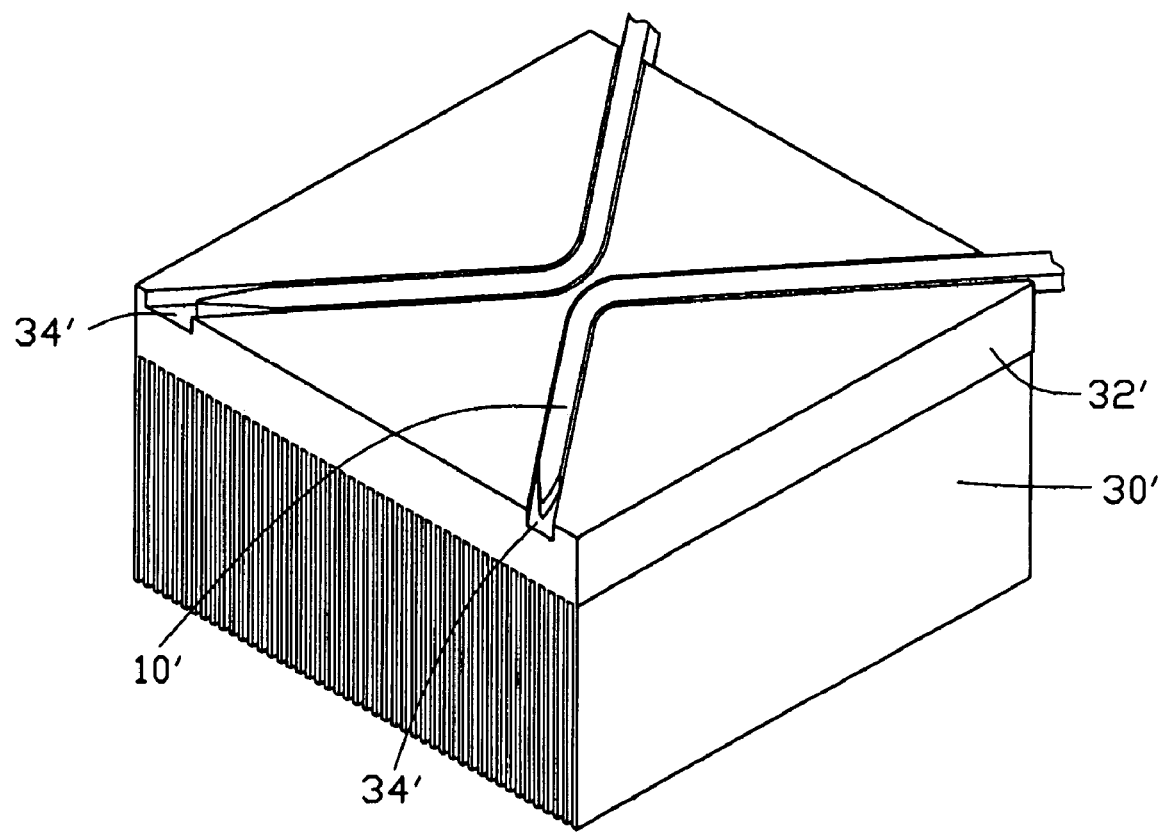
FIG. 3 is an assembled view of an upside-down heat dissipating device in accordance with a second embodiment of the present invention.

The heat dissipating device in FIGS. 1–2 merely comprises one linear heat pipe 10. While a heat dissipating device in FIG. 3 comprises a pair of curved heat pipes 10'. The heat sink 30' comprises a rectangular base 32'. A pair of symmetrically grooves 34' is defined in a side of the base 32'. The curved portions (not labeled) of the heat pipes 10' are positioned at a substantial central section of the side of the base 32', and portions at opposite sides of the curved portions extend toward four corners of the base 32'. The method to manufacture the heat dissipating device shown in FIG. 3, is same as the method to manufacture the heat dissipating device shown in FIGS. 1–2, except that a configuration of a solder bar (not shown in FIG. 3) is also curved according to the shape of the heat pipes 10'.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method of manufacturing a heat dissipating device, the method comprising steps:
    a) affording a heat pipe, a solid solder bar and a heat sink, wherein the heat sink comprises a base defining a groove at a side thereof;
    b) placing the solder bar and the heat pipe, in turn, into the groove of the heat sink;
    c) heating to melt the solder bar and simultaneously pressing the heat pipe to have an outer surface of the heat pipe coplanar with said side where the groove is defined; and
    d) cooling to achieve the heat dissipating device.

2. The method of claim 1, wherein a plurality of fins extends from an opposite side of the base.

3. The method of claim 1, wherein a depth of the groove is slightly greater than a thickness of the heat pipe.

4. The method of claim 1, wherein the heat pipe is flat.

5. The method of claim 1, wherein an exposed outer surface of the heat pipe is coplanar with said side of the base where the groove is defined.

6. The method of claim 1, wherein the base is rectangular.

7. The method of claim 6, wherein the heat pipe is curved, and wherein curved portion of the heat pipe is disposed at a substantial central section of said side and portions at opposite sides of the curved portion extend toward corners of the base.

8. The method of claim 1, wherein the solid solder bar is configured according to the shape of the groove before heated.

9. The method of claim 1, wherein the solder bar is evenly squeezed between the heat pipe and the base after the step c.

10. A method of manufacturing a heat dissipating device, comprising the steps of:
    providing a first main part of said device for dissipating heat, said first main part comprising a first surface for thermally contacting with a heat source and forming at least one groove in said first main part around said first surface;
    placing a solder bar in said at least one groove;
    placing a second main part of said device for dissipating heat totally in said at least one groove next to said solder bar, said second main part having a second surface for thermally contacting with said heat source;
    heating to melt said solder bar with a mold surface substantially parallel to both of said first and second surfaces of said first and second main parts and pressingly covering said first and second surfaces and said at least one groove; and
    cooling said heat dissipating device with presence of said pressingly covering of said mold surface against said first and second surfaces so as to get a final product thereof.

11. The method of claim 10, wherein said solder bar has a substantially same shape as a bottom of said at least one groove in said solder-bar-placing step.

12. The method of claim 10, wherein said second main part has a substantially same size as a volume of said at least one groove in said part-placing step.

13. A method of manufacturing a heat dissipating device, comprising the steps of:
    providing a heat sink of said device for dissipating heat, said heat sink comprising a base for thermally contacting with a heat source and forming at least one groove therein facing said heat source;
    placing a solder bar in said at least one groove;
    placing a heat pipe portion totally in said at least one groove next to said solder bar and closer to an exit of said at least one groove so as to be capable of thermally contacting with said heat source via said exit;
    covering pressingly said exit of said at least one groove and said base by means of a planer mold surface; and
    heating to melt said solder bar and then cooling said device with said pressingly covering of said mold surface so as to get a final product of said device.

14. The method of claim 13, wherein said solder bar has a substantially same shape as a bottom of said at least one groove in said solder-bar-placing step.

* * * * *